US010121463B2

(12) United States Patent
Moeller et al.

(10) Patent No.: US 10,121,463 B2
(45) Date of Patent: *Nov. 6, 2018

(54) NETWORKED SOUND MASKING SYSTEM

(71) Applicant: 777388 ONTARIO LIMITED, Oakville (CA)

(72) Inventors: Klaus Moeller, Oakville (CA); Niklas Moeller, Oakville (CA); Mircea Rusu, Toronto (CA); Carl Derla, Toronto (CA)

(73) Assignee: 777388 Ontario Limited, Oakville (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/060,433

(22) Filed: Mar. 3, 2016

(65) Prior Publication Data
US 2016/0189701 A1    Jun. 30, 2016

Related U.S. Application Data

(63) Continuation of application No. 13/890,824, filed on May 9, 2013, now Pat. No. 9,307,333, which is a (Continued)

(51) Int. Cl.
H04R 3/02 (2006.01)
G10K 11/175 (2006.01)
(Continued)

(52) U.S. Cl.
CPC ............ G10K 11/175 (2013.01); H04K 3/825 (2013.01); H04M 11/027 (2013.01);
(Continued)

(58) Field of Classification Search
CPC .... G10K 11/175; G10K 11/341; H04R 27/00; H04R 1/025; H04R 2201/021;
(Continued)

(56) References Cited

U.S. PATENT DOCUMENTS 3,980,827 A    9/1976 Sepmeyer
4,009,346 A *  2/1977 Parker ................ H04B 7/18528
                                                370/341
(Continued)

FOREIGN PATENT DOCUMENTS

AU    2002234468    9/2002
CA    2438639      9/2002
(Continued)

OTHER PUBLICATIONS

Xicor Application Note, AN115, 1998, "A compendium of Application Circuits for Xicor's Digitally-Controlled (XDCP) Potentiometers" by Wojslaw, pp. 1-5.
(Continued)

Primary Examiner — Lun-See Lao
(74) Attorney, Agent, or Firm — Workman Nydegger

(57) ABSTRACT

A sound masking system for shaping the ambient noise level in a physical environment. The sound masking system comprises a networked and distributed system having a number of master units coupled together and to a control unit. One or more of the master units may include satellite sound masking units which function to reproduce the sound masking signal generated by the master sound masking unit. Each of the master units is addressable over the network by the control unit enabling the control unit to program the contour, spectral band, and gain characteristics of the sound masking output signal. The system may also include a remote control unit which provides the capability to tune and adjust each master sound masking unit in situ without requiring physical access through the ceiling installation.

9 Claims, 15 Drawing Sheets

Related U.S. Application Data continuation of application No. 09/791,802, filed on Feb. 26, 2001, now Pat. No. 8,477,958.

(51) Int. Cl.

| | |
|---|---|
| *H04M 11/02* | (2006.01) |
| *H05K 5/02* | (2006.01) |
| *H04R 3/00* | (2006.01) |
| *H04R 27/00* | (2006.01) |
| *H04K 3/00* | (2006.01) |

(52) U.S. Cl.
CPC ............. *H04R 3/002* (2013.01); *H04R 27/00* (2013.01); *H05K 5/0247* (2013.01); *G10K 2210/3014* (2013.01); *G10K 2210/3049* (2013.01); *G10K 2210/30351* (2013.01); *H04K 3/42* (2013.01); *H04K 3/43* (2013.01); *H04K 3/45* (2013.01); *H04K 2203/12* (2013.01); *H04K 2203/34* (2013.01)

(58) Field of Classification Search
CPC ........ H04R 3/002; H04R 3/02; H04R 1/1041; H04R 1/1083; H04R 3/12; H04R 5/033; H04R 2430/20
USPC ............... 381/73.1, 71.1–71.4, 74, 104–109, 381/97–100, 103, 94.1–94.4, 56–58; 700/94

See application file for complete search history.

(56) References Cited

U.S. PATENT DOCUMENTS

| | | | |
|---|---|---|---|
| 4,035,589 A | 10/1977 | Parke | |
| 4,052,720 A | 10/1977 | McGregor et al. | |
| 4,054,751 A | 10/1977 | Calder et al. | |
| 4,185,167 A | 1/1980 | Cunningham et al. | |
| 4,241,235 A | 12/1980 | McCanney | |
| 4,319,088 A * | 3/1982 | Orfield | G10K 11/175 381/73.1 |
| 4,438,526 A | 3/1984 | Thomalla | |
| 4,476,572 A | 10/1984 | Horrall et al. | |
| 4,612,665 A | 9/1986 | Inami et al. | |
| 4,686,693 A * | 8/1987 | Ritter | G10K 11/175 381/73.1 |
| 4,761,921 A | 8/1988 | Nelson | |
| 4,914,706 A | 4/1990 | Krause | |
| 5,386,478 A | 1/1995 | Plunkett | |
| 5,406,634 A * | 4/1995 | Anderson | H04R 27/00 381/80 |
| 5,440,644 A | 8/1995 | Fairnelli et al. | |
| 5,584,051 A * | 12/1996 | Goken | H04H 20/22 340/7.43 |
| 5,666,424 A | 9/1997 | Fosgate et al. | |
| 5,675,830 A | 10/1997 | Satula | |
| 5,689,229 A | 11/1997 | Chaco et al. | |
| 5,764,763 A | 6/1998 | Jensen et al. | |
| 5,826,172 A | 10/1998 | Ito et al. | |
| 5,887,067 A | 3/1999 | Costa et al. | |
| 6,145,085 A | 11/2000 | Tran et al. | |
| 6,188,771 B1 | 2/2001 | Horrall et al. | |
| 6,329,908 B1 | 12/2001 | Frecska | |
| 6,389,139 B1 | 5/2002 | Curtis et al. | |
| 6,594,365 B1 | 7/2003 | Eatwell | |
| 6,775,355 B1 | 8/2004 | Bingel et al. | |
| 6,847,625 B2 | 1/2005 | Heinonen et al. | |
| 6,888,945 B2 | 5/2005 | Horrall et al. | |
| 7,194,094 B2 | 3/2007 | Horrall et al. | |
| 7,471,797 B2 | 12/2008 | Moeller et al. | |
| 7,571,014 B1 | 8/2009 | Lambourne | |
| 8,107,639 B2 | 1/2012 | Moeller et al. | |
| 8,477,958 B2 * | 7/2013 | Moeller | G10K 11/175 381/73.1 |
| 8,666,086 B2 | 3/2014 | Moeller et al. | |
| 8,817,999 B2 | 8/2014 | Moeller et al. | |
| 9,307,333 B2 * | 4/2016 | Moeller | G10K 11/175 |
| 10,038,952 B2 | 7/2018 | Labrosse et al. | |
| 2002/0072816 A1 | 6/2002 | Shdema | |
| 2002/0150261 A1 | 10/2002 | Moeller et al. | |
| 2003/0091199 A1 | 5/2003 | Horrall et al. | |
| 2003/0107478 A1 | 6/2003 | Hendricks et al. | |
| 2003/0142833 A1 | 7/2003 | Roy et al. | |
| 2003/0144847 A1 | 7/2003 | Roy et al. | |
| 2003/0198339 A1 | 10/2003 | Roy et al. | |
| 2003/0219133 A1 | 11/2003 | Horrall et al. | |
| 2004/0013280 A1 | 1/2004 | Garstick | |
| 2004/0131199 A1 | 7/2004 | Moeller et al. | |
| 2004/0179699 A1 | 9/2004 | Moeller et al. | |
| 2004/0240686 A1 | 12/2004 | Gibson | |
| 2007/0133816 A1 | 6/2007 | Horrall et al. | |
| 2009/0116659 A1 | 5/2009 | Moeller et al. | |
| 2013/0243215 A1 | 9/2013 | Moeller et al. | |

FOREIGN PATENT DOCUMENTS

| | | |
|---|---|---|
| CA | 2681915 | 9/2002 |
| CA | 2845172 | 9/2002 |
| CA | 2422086 | 9/2004 |
| CA | 2690511 | 9/2004 |
| CA | 2653803 | 1/2008 |
| CA | 2634268 | 12/2009 |
| CN | 1505811 | 6/2004 |
| EP | 1364363 | 11/2003 |
| EP | 2036077 | 1/2008 |
| WO | 02069317 | 9/2002 |
| WO | 2008000092 | 1/2008 |

OTHER PUBLICATIONS

Atlas Sound MG2500 Sound Masking Generator with 2-Ennis, Channel DSP and Page Input Operation Manual. Atlas Sound, TX; Apr. 2002.
"What is SoundMasker", SoundMasker-White Noise Generator/ Sound Masking Software, Get a Good Nights Sleep; Copyright 2003 Vector Media; p. 1.
http://drugstore.com; HoMedics SoundSpa Acoustic Relaxation Machine, Model SS-200-3PK; p. 1-3.
http://marpac.com/sound-cond.asp; Sound Conditioners; pp. 1-6.
http://store.yahoo.com/egeberalmedical/no.html; Sound Conditions, White Noise Machines and Safety Lights; pp. 1-2.
http://www.maggiescottage.com/soundtherapy.html; Maggies Cottage-Homedics White Noise Machine & SensorySound Spa; pp. 1-2.
http://www.officebuzz.qpg.com/; The Sonet Acoustic Privacy System; pp. 1-2.
http://www.sharperimage.com; Search by Keyword: Sound Soother; pp. 1-6.

* cited by examiner

NETWORKED SOUND MASKING SYSTEM

CROSS-REFERENCE TO RELATED APPLICATIONS

This invention is a continuation of U.S. patent application Ser. No. 13/890,824, filed on May 9, 2013, entitled "Networked Sound Masking System," which is a continuation of U.S. Pat. No. 8,477,958, filed on Feb. 26, 2001, also entitled "Networked Sound Masking System." The entire content of each of the foregoing patent applications is incorporated herein by reference.

FIELD OF THE INVENTION

The present invention relates to sound masking, and more particularly to a networked and remote controllable sound masking system.

BACKGROUND OF THE INVENTION

Sound masking systems are widely used in offices and similar workplaces where an insufficient level of background sound results in diminished speech privacy. Such environments suffer from a high level of noise distractions, and lower comfort levels from an acoustic perspective. Sound masking systems operate on the principle of masking which involves generating a background sound in a given area. The background sound has the effect of limiting the ability to hear two sounds of similar sound pressure level and frequency simultaneously. By generating and distributing the background noise in the given area, the sound masking system masks or covers the propagation of other sounds in the area and thereby increases speech privacy, reduces the intrusion of unwanted noise, and improves the general acoustic comfort level in the area or space.

Sound masking systems are of two main types: centrally deployed systems and independent self-contained systems. In a centrally deployed system, a central noise generating source supplies a series of loudspeakers installed throughout the physical area or space to be covered. The independent self-contained system comprises a number of individual self-contained sound masking units which are installed in the physical space. The sound masking units operate independently of each other, but may include a number of satellite speakers which extend the range of each self-contained, i.e. master, sound masking unit. Most sound masking systems include the capability for broadcast announcements and music over the loudspeakers contained in the sound masking units.

The primary goal of sound masking systems is to provide an unobtrusive, effective masking sound that is adjustable for maximum consistency, and offers the ability to meet the requirements of the occupants. The masking output is preferably sufficient to accommodate the existing acoustic requirements of the workplace environment and adjustable to handle changes to the acoustic characteristics of environment which occur over time. Similar demands are placed on the system for the public address and music functions. In short, the preferred sound masking system would produce an output with a frequency and volume level that is controllable to produce the desired acoustic response for workplace zones ranging in size from the smallest to larger spaces.

Centralized systems are characterized by achieving uniformity of output, but not uniformity of acoustic response for the space. In a centralized system, the frequency spectrum of the sound masking output can only be adjusted at a centrally located equalizer, and as a result the sound masking output has the same frequency spectrum for all of the loudspeakers. Depending on the configuration of the centralized system, volume adjustments may be made for very large physical spaces, i.e. zones, by adjusting the amplifier output; for relatively smaller zones, volume adjustments are made by changing wiring connections or controls on the speaker enclosure, or by adjusting a hardwired zone volume control. In practice, it is difficult to accommodate environmental acoustic variations using a centralized system because the volume and frequency spectrum adjustments required for the typical physical zone size are too large to achieve a uniform acoustic result. A further disadvantage is that many of the adjustments for a centralized sound masking system require an installer or technician to re-enter the ceiling space or to rewire the speakers in the system.

The independent self-contained system has a number of important advantages over the centralized arrangement. The independent self-contained system is more effective in terms of sound generation, volume adjustment, and frequency adjustment which, in turn, improves the performance of such systems as compared to centralized systems. In particular, the independent self-contained system provides a defined non-frequency specific output range for the masking output spectrum, and adjustments can be made at each master sound masking unit. The volume controls for an independent self-contained system also provide more flexibility than in the centralized system, and provide for finer adjustments in smaller zones, in addition to centralized volume controls for large zone or global adjustment. However, with existing systems it is still necessary to re-enter the ceiling to adjust the frequency spectrum and volume output level for each master sound masking unit, and the controls for providing multi-unit volume zone adjustments require the hardwiring of the units.

While existing independent self-contained systems are more flexible than centralized systems in many regards, they do not satisfy all the requirements of an ideal sound masking system as discussed above. Furthermore, other shortcomings are associated with existing sound masking systems. In both centralized and independent self-contained systems, the public address and music volume controls are limited in the same manner as described above for sound masking output volume controls. Second, any centrally located controls only affect the output level for the speakers or sound masking units which have a hardwired connection. It will be appreciated that this severely limits the adjustability of the system to future changes in the acoustic environment unless at least some of the system is rewired. Third, the tuning procedure for existing systems is time consuming and can still be inaccurate over the system even when undertaken with the appropriate level of skill and attention. And fourthly, adjustments to existing systems must be made on-site.

Accordingly, there remains a need for a networked sound masking system with individually controllable and programmable sound masking units, and which system is easily adaptable to changing sound qualities in a physical space or spaces in a building environment.

BRIEF SUMMARY OF THE INVENTION

The present invention provides a networked sound masking system with individually controllable and programmable sound masking units.

In a first aspect, the present invention provides a sound masking system for controlling the ambient noise level in a physical environment, the sound masking system comprises:

(a) a communication network spanning at least a portion of the physical environment; (b) a plurality of sound masking units, some of the sound masking units include a sound masking component for generating a sound masking output signal and some of the sound masking units include a communication interface for coupling the sound masking units to the communication network for receiving control signals over the communication network; (c) a control unit having a communication interface for coupling to the communication network for transmitting control signals over the communication network to the sound masking units, and the control signals include signals for controlling the operation of at least some of the sound masking units.

In another aspect, the present invention provides a sound masking system for shaping the ambient noise level in a physical environment, the sound masking system comprises: (a) a communication network spanning at least a portion of the physical environment; (b) a plurality of sound masking units, some of the sound masking units include a sound masking circuit for generating a sound masking output signal for shaping the ambient noise level in the vicinity of each of the sound masking units, a programmable controller and at least one digital component for controlling operation of the sound masking circuit, and a communication interface for coupling the sound masking units to the communication network, and the programmable controller being coupled to the communication network for receiving control signals from the communication network for altering the operation of the sound masking circuit; (c) a control unit, the control unit having a communication interface for coupling the control unit to the communication network for transmitting control signals over the communication network to the sound masking units, and the control signals include signals for controlling the operation of at least some of the sound masking units; (d) wherein the sound masking circuit comprises a random noise generating component for generating an incoherent signal output, a filter component for receiving the incoherent signal output and generating an incoherent signal output with a predetermined contour, and an output amplifier for amplifying the contoured incoherent signal output, and the digital component comprising a digital potentiometer coupled to the filter component for altering the contour of the incoherent signal output in response to control signals from the programmable controller.

In a further aspect, the present invention provides a networked sound masking system for controlling ambient noise level in a physical environment, the networked sound masking system having a communication network for coupling a plurality of sound masking units, the sound masking units span the physical environment, the sound masking units include a sound masking component for generating a sound masking output signal and include a communication interface to the communication network for receiving control signals over the communication network, and a control unit having a communication interface for coupling the control unit to the communication network for transmitting control signals to the sound masking units, and the control signals include signals for selectively controlling the operation of the sound masking units, a remote control unit for generating adjustment signals for the control unit for adjusting characteristics of the sound masking signal output produced by the sound masking units, the remote control unit comprises: (a) a remote communication interface for transmitting the adjustment signals to the control unit, and the control unit has an external communication interface compatible with the remote communication interface; (b) an input component for receiving sound level readings for the physical environment; (c) a component responsive to the sound level readings for generating the adjustment signals associated with the characteristics of the sound masking output signal for the sound masking units.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Reference will now be made to the accompanying drawings, which show, by way of example, a preferred embodiment of the present invention, and in which.

DETAILED DESCRIPTION OF THE PREFERRED EMBODIMENT

Figure 1:
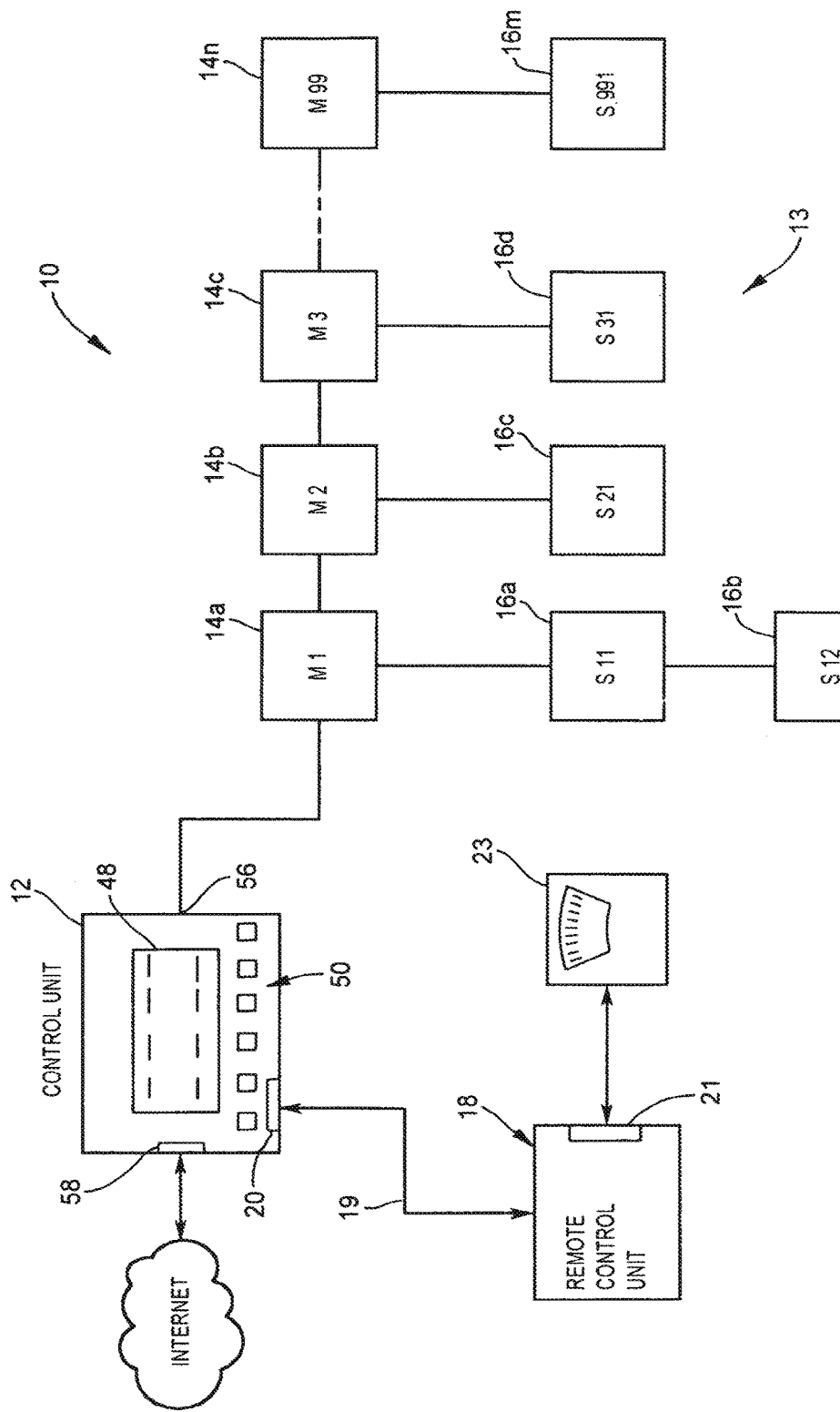
FIG. 1 shows in block diagram form a networked sound masking system according to the present invention.

Reference is first made to FIG. 1, which shows in block diagram form a networked sound masking system according to the present invention and indicated by reference 10.

As shown in FIG. 1, the networked sound masking system 10 comprises a control unit 12, and a network 13 comprising a plurality of master sound masking units 14, indicated individually by 14a, 14b, 14c, . . . 14n, and one or more satellite sound masking units 16, indicated individually by 16a, 16b, 16c, 16d, . . . 16m. The physical connections for the network 13 between the master sound masking units 14 may comprise 5, 4 or 3 conductors. In a 5 conductor arrangement, two conductors carry power, two conductors provide a communication channel, and one conductor provides for paging.

The master sound masking unit 14 and the satellite sound masking units 16 provide the sound masking functionality, i.e. sound masking and signal generation and amplification. Each sound masking group, i.e. master sound masking unit 14 together with the associated satellite sound masking units 16, is configured for a particular physical spaces, e.g. office, room, zone in a open office, etc. The master sound masking units 14 are configured to generate a specific sound masking signal at a specified output level for performing the sound masking in the physical space. As will be described in more detail below, the sound masking signal is generated according to programmable spectrum, equalizer, and volume settings. The satellite sound masking units 16 are connected to their associated master unit 14 and comprise a speaker which reproduces the sound masking signal generated by the master unit 14. The satellite units 16 provide a cost-effective way to expand the coverage of the master sound masking unit 14 in a building space.

The control unit 12 as will be described in more detail couples to the network 13 and provides the capability to adjust the functional aspects of the master sound masking units 14 and the satellite sound masking units 16. The sound masking functions include masking signal spectrum, masking signal output volume, and paging volume. The control unit 12 also provides diagnostic functions and timer control functions. The control unit 12 may also include testing functions, such as a test function which compares existing sound measurements to the desired sound parameters for the space and calculates the adjustments to be made.

The control unit 12 configures the network 13 by assigning identities or addresses to each of the master units 14. The addressing of the individual master units 14 enables the control unit 12 to direct commands and/or status requests to individual master sound masking units 14 (and the associated satellite sound masking units 16), or to groups of master sound masking units 14, or to the entire network 13 as a whole. The control unit 12 is then used to set/adjust the masking signal spectrum, the masking signal volume, and/or the paging volume for the selected (i.e. addressed) master and satellite sound masking units 14 and 16. According to another aspect, the master sound masking units 14 may include a digital equalizer for providing greater programming flexibility over the spectrum for the sound masking signal generated by the selected master and satellite sound masking units 14 and 16.

As also shown in FIG. 1, the system 10 may include a remote control unit 18. The remote control unit 18 works in conjunction with the control unit 12 to display and/or change the current adjustment settings (i.e. spectrum adjustment settings, equalizer settings, masking signal volume level, and paging volume) for the master units 14. As described below, the remote control unit 18 can accept as input sound measurements taken by a sound level meter, or another configuration the remote control unit 14 allows a user to measurements of the acoustical environment for the building space. The remote control unit 18 communicates with the control unit 12 through a communication interface 20, for example a radio signal channel, indicated by reference 19.

In addition to the communication channel 19 for the remote control 18, the control unit 12 may also include another communication interface 58. The communication interface 58 provides the capability to access the control unit 12 via a remote location, e.g. an offsite location. The communication interface 58 may comprise a telephone communication, radio communication, computer network (e.g. a Local Area Network (LAN) or a Wide Area Network (WAN)), or a connection through the Internet or World Wide Web (WWW). This provides greater flexibility in configuring, adjusting and maintaining the sound masking system 10 from a remote or off-site location.

Figure 2:
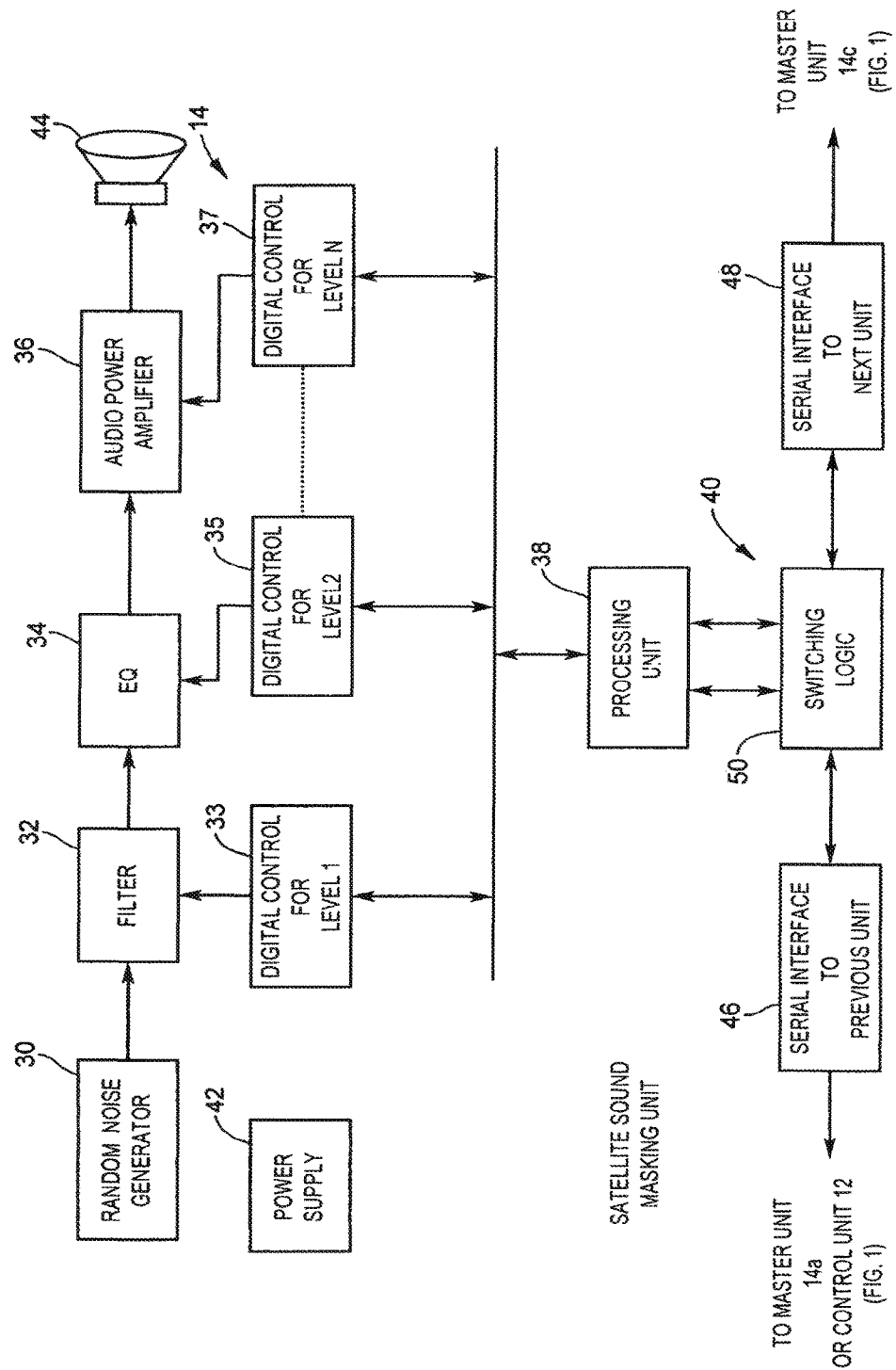
FIG. 2 shows a sound masking unit in block diagram form for the networked sound masking system of FIG. 1.

Reference is next made to FIG. 2 which shows the master sound masking unit 14 in greater detail. As shown in FIG. 2(a), the master unit 14 comprises a random noise generator stage 30, a filter stage 32, an equalizer stage 34, and an audio power amplifier stage 36. The operation of the stages 30, 32, 34, 36 is controlled by a microcontroller 38. As also shown, the master sound masking unit 14 includes a communication interface 40. The communication interface 40 couples the master unit 14 to the network 13 and provides the capability to communicate with the control unit 12 and other master sound masking units 14b, 14c in the network 13. The master unit 14 includes a local power supply 42 for powering the circuitry. The audio power amplifier stage 36 drives a speaker 44 which emits the sound masking signal.

The random noise generator stage 30 is the signal source for generating the sound masking signal. The random noise generator 30 may comprise a multi-stage shift register and an Exclusive-OR gate network as described in U.S. Pat. No. 4,914,706 which issued to the assignee in common with the subject application. Alternatively, the random noise generator module 30 may be implemented in firmware executed in the microcontroller 38. The random noise generator 30 may also be implemented as an operational amplifier which couples and amplifies the noise produced by a voltage regulator circuit, such as a Zener diode.

The filter stage 32 is coupled to the output of the random noise generator 30. The filter stage 32 comprises two filters connected to the respective outputs of the last two stages of the shift register (not shown) in the random noise generator 30 as described in U.S. Pat. No. 4,914,706. Each of the filters comprises a resistive-capacitive ladder network, with one of the filters having a higher cut-off frequency than the other filter. Using this arrangement, each of the filters derives a different output signal from the random noise generator 30 with each of the output signals having a different spectral shape within the defined audio frequency range.

In the preferred embodiment, the filter stage 32 is coupled to the microcontroller 38 through a digital control device 33. The digital control device 33 comprises a potential divider which is connected between the output ends of the filters in the filter stage and under the control of the microcontroller 38 the output contour of the filter stage 32 is programmable. The digital control device 33 is preferably implemented using a digital potentiometer, such as the device available from XICOR Corp., and has a continuously adjustable tap with at least 32 tap positions. The tap positions are selectable by the microcontroller 38, and by changing the tap positions the spectral shape of the noise signal output from the random noise generator 30 is controllable.

The equalizer stage 34 comprises an one-third Octave equalizer which is used for adjusting the sound spectrum of the noise signal output to the desired contour. In the preferred embodiment, the equalizer comprises 18 adjustable bandpass filter cells for the ⅓ Octave band and 7 adjustable bandpass filter cells for the 1/1 Octave band, and an adder for summing the outputs. Each filter cell is implemented using an operational amplifier or OP Amp, fixed resistors and capacitors as will be within understanding of one skilled in the art. Preferably, each of the filter cells is coupled to the microcontroller 38 through a digital control device 35, such as a digital potentiometer to provide for the independent adjustment of the cell about a fixed center frequency under the control of the microcontroller 38. In the present embodiment, the ⅓ Octave Band frequencies comprise 160, 200, 250, 315, 400, 500, 630, 800, 1000, 1250, 1600, 2000, 2500, 3150, 4000, 5000, 6300 and 8000 Hertz (Hz). The 1/1 Octave Band frequencies comprise 125, 250, 500, 1000, 2000, 4000, and 8000 Hz. Each filter cell is preset to the prescribed contour, e.g. 48 dB<V.sub.f1<57 dB and 24 step<DigiPot.sub.1<30 step. The output from the equalizer stage 34 is a sound masking signal with a controllable contour which is fed to the amplifier power stage 36.

The audio power stage 36 provides a controllable output level for the contoured sound masking signal. The contoured sound masked signal is amplified by the audio power stage 36 and output to the speaker 44 which emits a sound masking sound into the physical space. The audio power stage 36 also provides an adjustable amplification level for the providing paging announcements, background music or other broadcasts over the speaker. In the preferred embodiment, the output level of the audio power stage 36 is also controllable by the microcontroller 38 through a digital control device 37. Preferably, the digital control device 37 comprises a digital potentiometer having at least 32 step settings.

Referring still to FIG. 2, the communication interface 40 comprises a first serial interface 46, a second serial interface 48, and a switching logic stage 50. The communication interface 40 couples the microcontroller 38 to the network 13 and allows the unit 14 to receive and transmit status requests and control commands. The switching logic stage 50 connects the microcontroller 38 to the first and second serial interfaces 46 and 48. The first serial interface 46 allows the microcontroller 38 to communicate with an upstream device, for example, the master sound masking unit 14a or the control unit 12. The second serial interface 48 allows the microcontroller 38 to communicate with a downstream device, for example, the master sound masking unit 14c. In conjunction with the switching logic stage 50, the microcontroller 38 monitors the serially encoded messages and acts upon messages which are addressed to the specified master sound masking unit 14. Each of the master sound masking units 14 is assigned an address according to a self-addressing mechanism as will be described in more detail below.

The satellite sound masking units 16 are associated with respective master sound masking units 14. The satellite sound masking units 16 each include a speaker, and are coupled to one of the master sound masking units 14. The satellite sound masking units 16 act as slaves or satellites to the master sound masking unit 14 and reproduce the sound masking signal output generated by the associated master sound masking unit 14.

Figure 3:
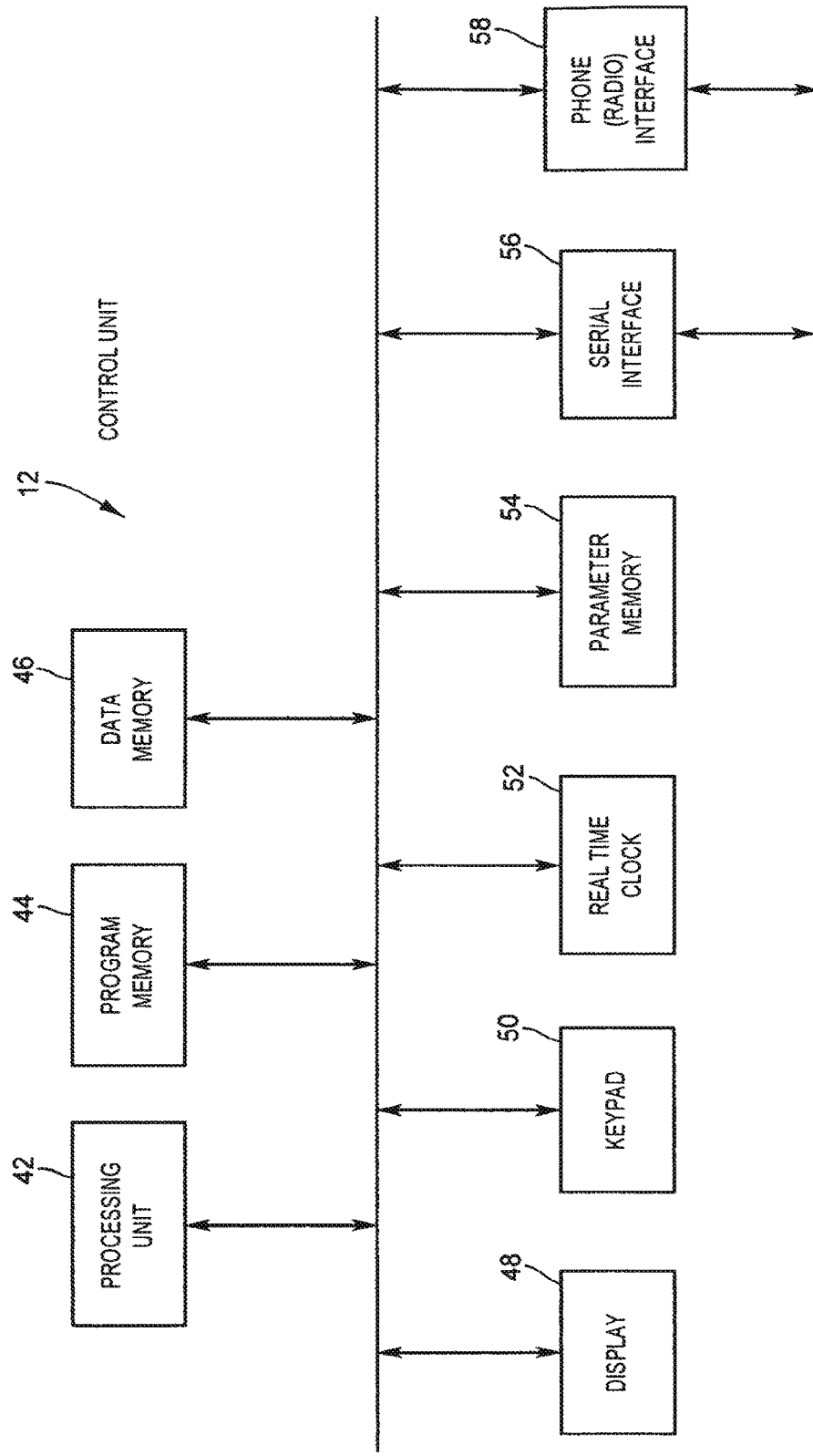
FIG. 3 shows in block diagram form a control unit for the networked sound masking system of FIG. 1.
Figure 4:
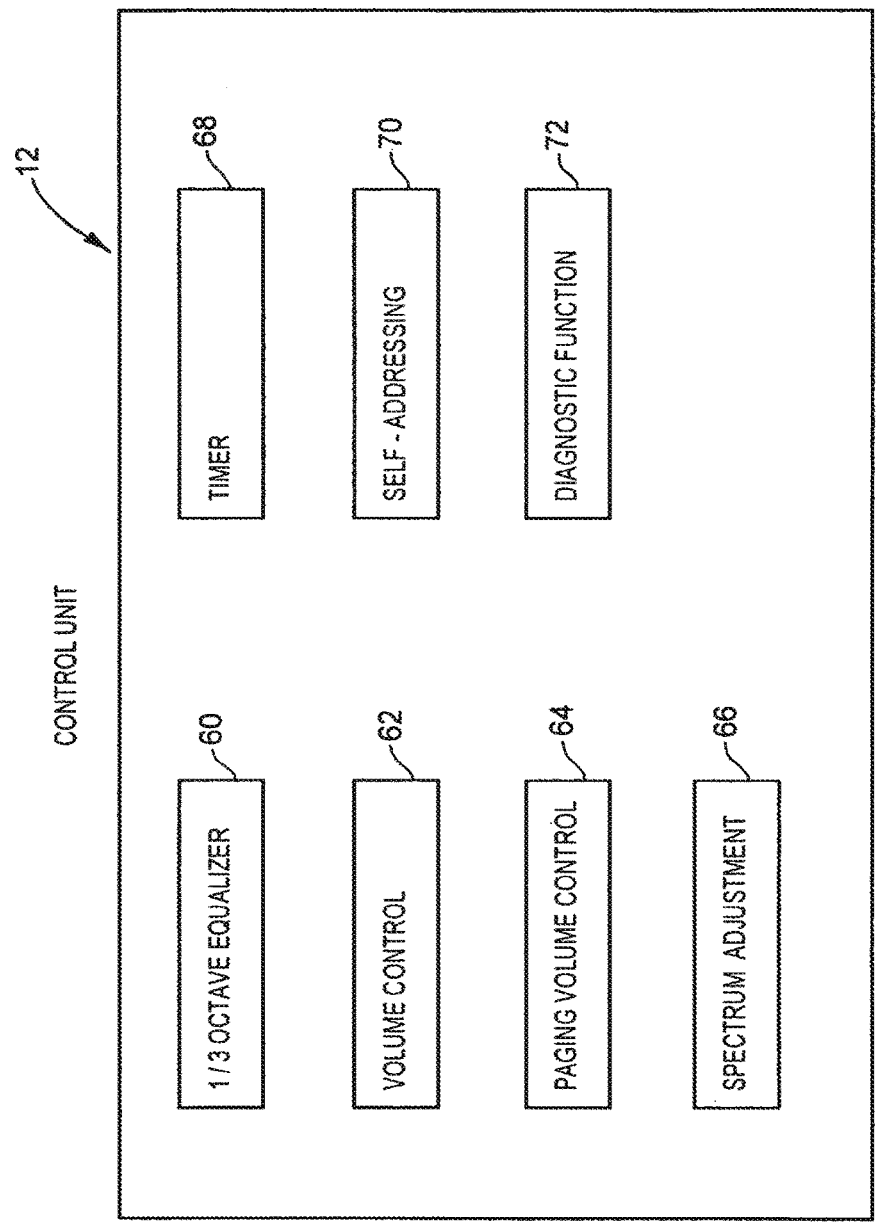
FIG. 4 shows the control unit of FIG. 3 in more detail, and in particular the functional modules for the control unit.

Reference is next made to FIG. 3, which shows the control unit 12 in more detail. As shown, the control unit 12 comprises a processor unit (i.e. a microprocessor) 42, a program memory 44, a data memory 46, a display module 48, a keypad 50, a real-time clock module 52, a parameter memory 54, a serial communication interface 56, and the communication interface 58. As shown in FIG. 4, the control unit 12 includes a functional module 60 to control the ⅓ Octave equalizer 34 (FIG. 2(a)), a functional module 62 to provide volume control, a functional module 64 to provide paging volume control, a functional module 66 to provide spectrum adjustment control of the contoured sound masking signal, a functional module 68 to provide timer functions for the system 10, a functional module 70 to provide addressing of the master sound masking units 14 in the network 13, and a functional module 72 for performing diagnostic functions. The operation of the functional modules in the control unit 12 is now described in more detail with reference to the flowcharts in FIGS. 5 to 17.

Figure 5:
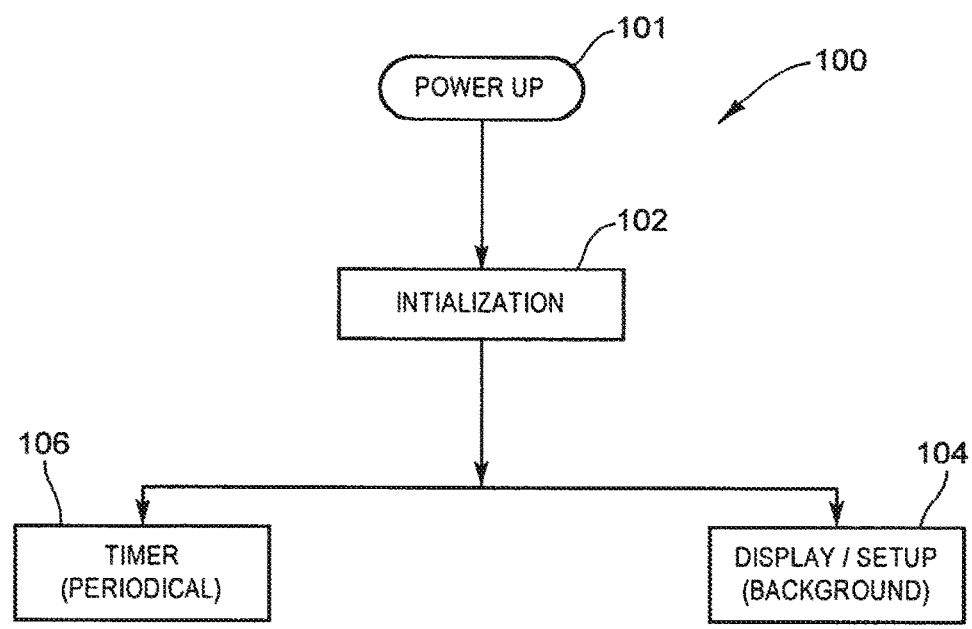
FIG. 5 shows in flowchart form a main functional processing method for the control unit of FIG. 3.

Reference is first made to FIG. 5, which shows a start-up process 100 for the control unit 12. The start-up process 100 is executed in response to a power-up 101 or a reset condition. The start-up process 100 comprises an initialization step 102 which includes configuring the control unit 12. After the initialization step 102, the control unit 12 runs a display/setup operation 104 as a background loop, and a timer operation 106. The timer operation 106 is periodically executed, for example, on an interrupt driven basis or as part of a polling loop in the display/setup operation.

Figure 6:
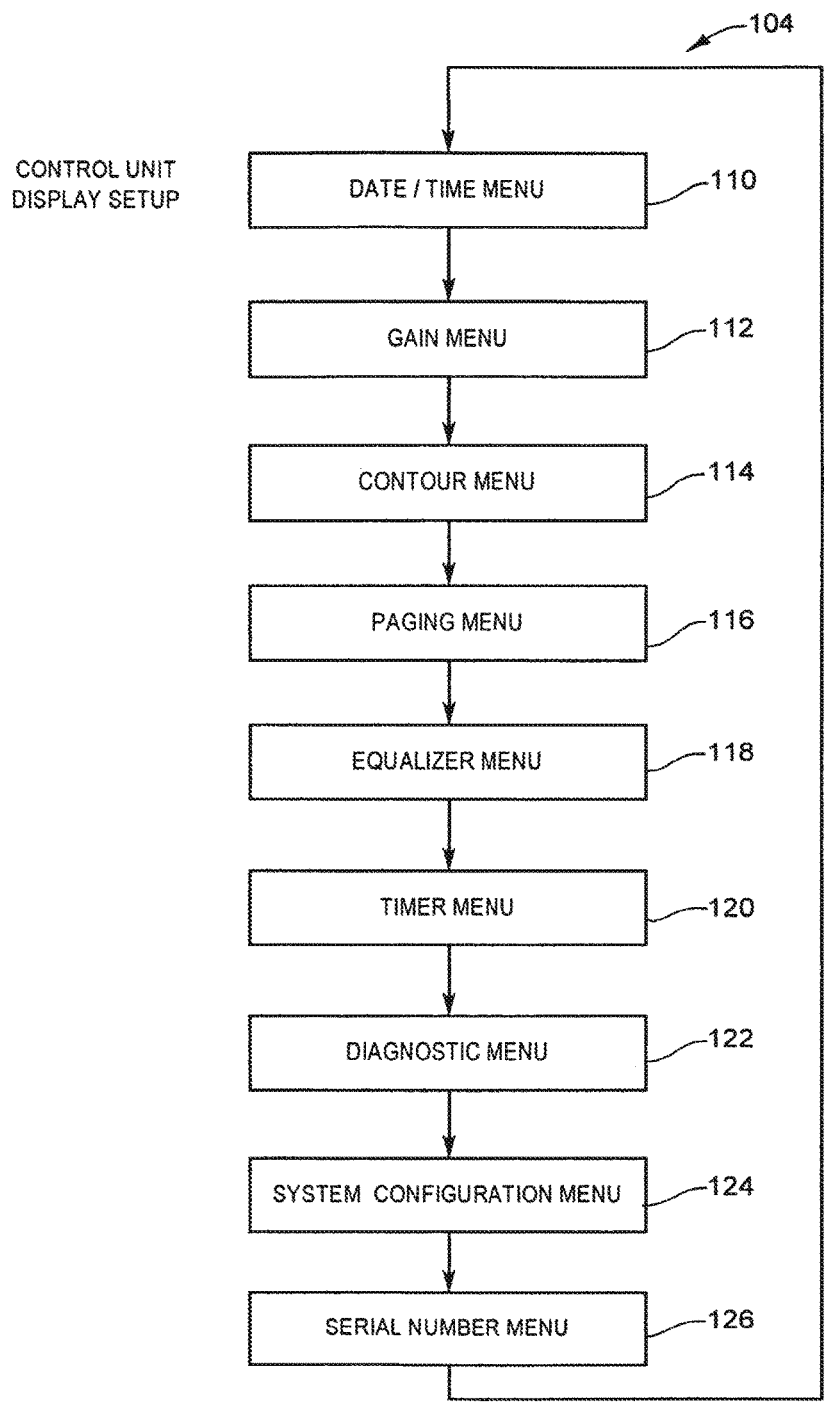
FIG. 6 shows in flowchart form the processing steps for the display/setup function in the control unit for the networked sound masking system according to the present invention.

Reference is next made to FIG. 6, which shows the display/setup operation 104 in more detail. As shown the display/setup operation 104 comprises displaying a series of menu functions on the display 48 (FIG. 1) which are accessed via selections from the keypad 50 (FIG. 1). As shown in FIG. 6, the menu functions include a Date/Time function menu 110, a Gain function menu 112, a Contour menu function 114, a Paging Volume function menu 116, an Equalizer Setting function menu 118, a Timer function menu function 120, a Diagnostic function menu 122, a System Configuration function menu 124, and Serial Number function menu 126.

Figure 7:
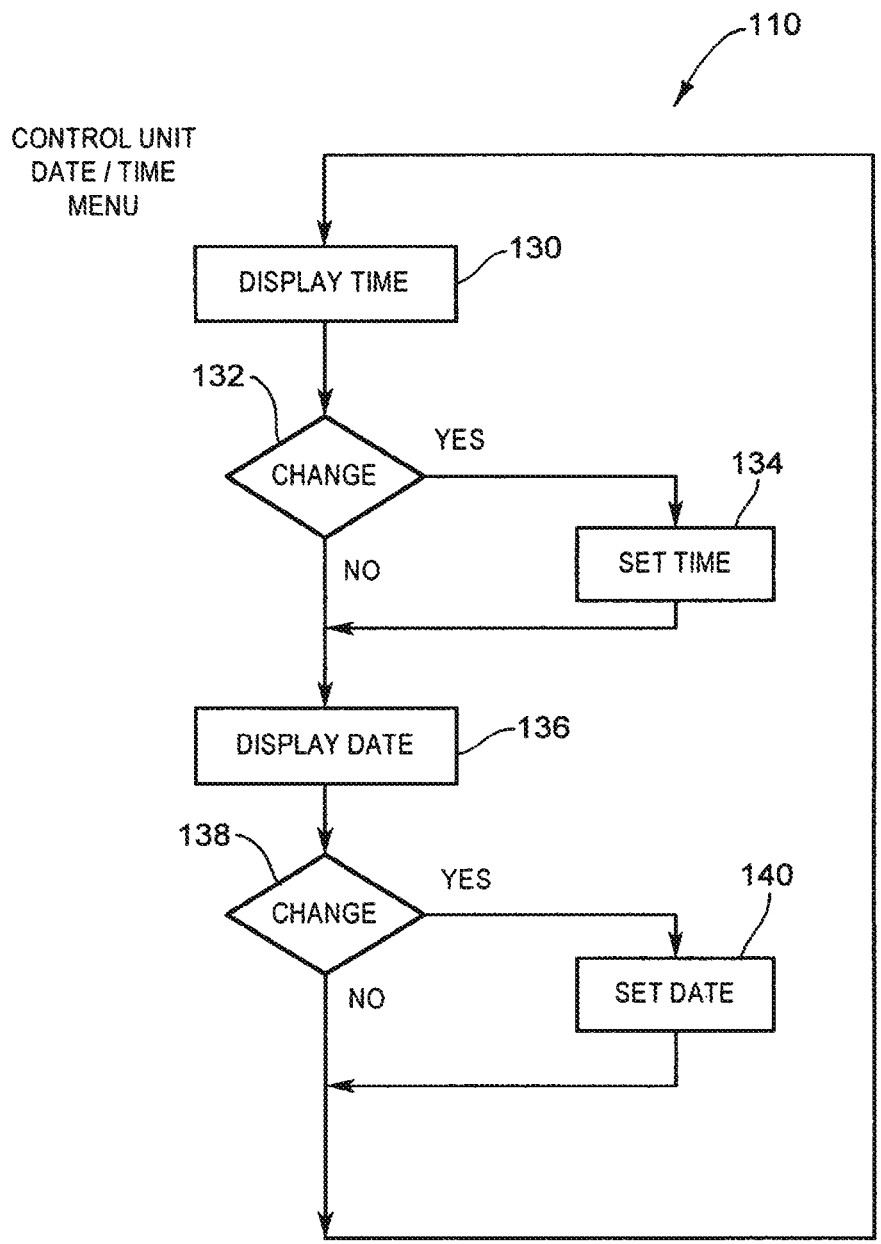
FIG. 7 shows in flowchart form the processing steps for the timer function in the control unit for the networked sound masking system.

The processing steps for the Date/Time function menu 110 are shown in FIG. 7. The first step comprises displaying the time 130 and prompting the user to change the time 132. If the user selects to change the time, then a set time procedure 134 is executed. Otherwise the date is displayed 136, and the user is prompted to change the date 138. If the user selects to change the date, a set date procedure 140 is executed.

Figure 8:
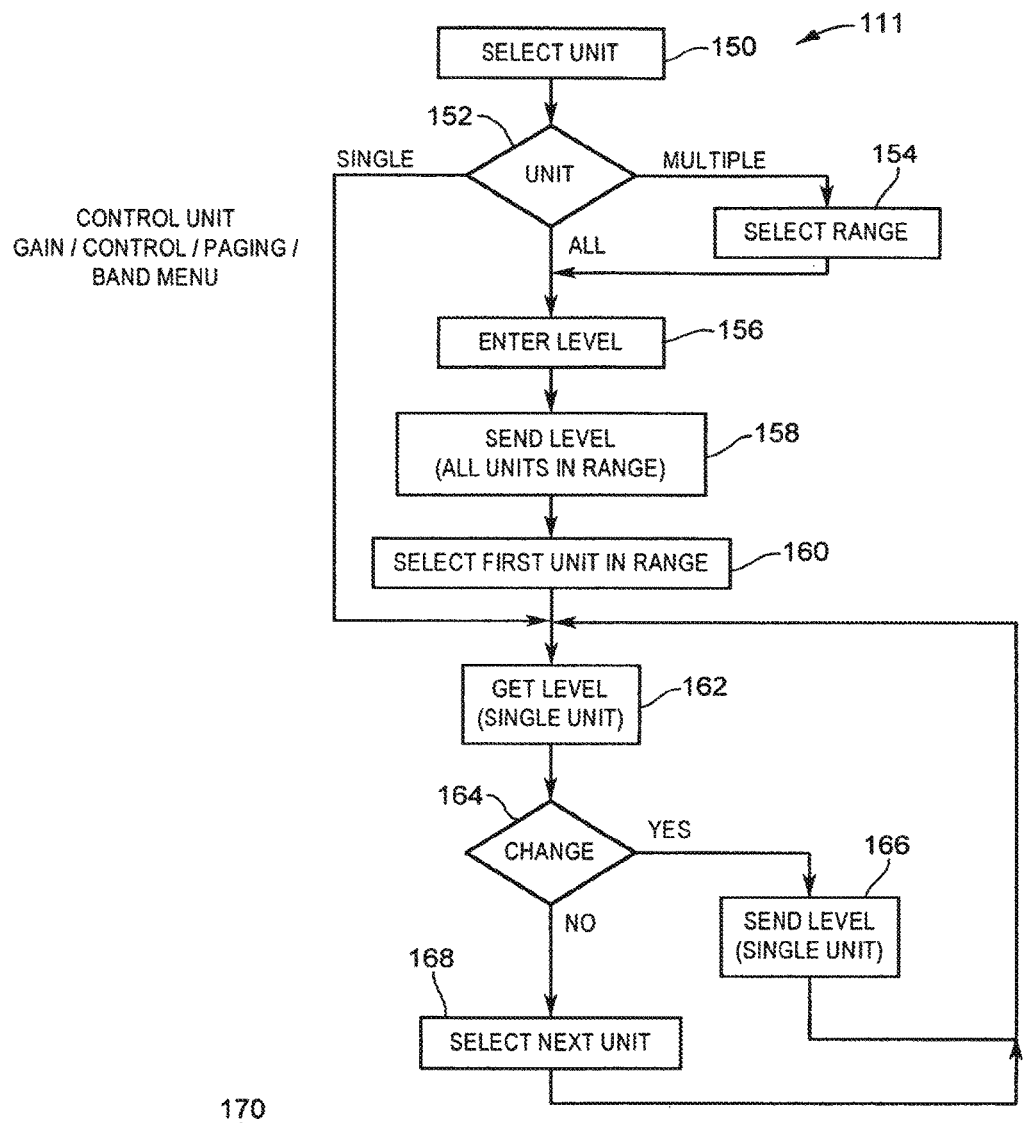
FIG. 8 shows in flowchart form the processing steps for the gain/contour/paging/band setting functions in the control unit for the networked sound masking system.

Reference is next made to FIG. 8, which shows in more detail the processing steps for setting the Gain function 112, the Contour Control function 114, the Paging Volume function 116, and the Equalizer Band function 118. The steps for controlling each of these functions is implemented according to the process 111 shown in FIG. 8. As shown, the first step comprises selecting the master sound masking unit. In decision block 150, a selection is made between a single master sound masking unit 14 or multiple master sound masking units 14. If multiple master sound masking units 14 are to be configured, then the next step 154 involves selecting the range for the sound masking units 14. The sound masking level, i.e. the gain, for the sound masking units 14 in the range is entered in block 156 and transmitted via the network 13 to all the sound masking units 14 in the selected range. After the sound masking level has been sent to the sound masking units 14 in the range, the first sound masking unit 14a in the range is selected, i.e. addressed.

Referring still to FIG. 8, the next step 162 involves reading the sound masking gain level setting for the master sound masking unit 14 which was selected in step 160 or as a result of the branch from decision block 152. The gain level setting received from the sound masking unit 14 is compared to the desired setting stored in the control unit 12, and if a change in the sound masking level is needed as determined in decision block 164, then the desired sound masking gain level setting is sent to the selected master sound masking unit 14 in block 166. If no change is indicated for the selected master sound masking unit 14, then the next master sound masking unit 14 in the network 13 is selected, i.e. addressed, and the steps 162 and 164 are repeated. The same processing steps are utilized for setting the Contour Control function 114, the Paging Volume function 116, and the Equalizer Band function 118.

Figure 9:
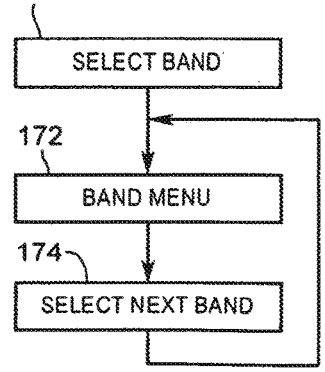
FIG. 9 shows in flowchart form the processing steps for the equalizer function in the control unit for the networked sound masking system.

Reference is next made to FIG. 9, which shows in more detail the processing steps for the operation of the Octave equalizer module 60 for the control unit 12. The first step 170 comprises prompting the user to select the desired equalizer band. As described above, the ⅓ Octave Band frequencies comprise 160, 200, 250, 315, 400, 500, 630, 800, 1000, 1250, 1600, 2000, 2500, 3150, 4000, 5000, 6300 and 8000 Hertz (Hz).; and the 1/1 Octave Band frequencies comprise 125, 250, 500, 1000, 2000, 4000, and 8000 Hz. Next in block 172, the band menu for the selected band is displayed, and the user is prompted to enter the setting for the band. The control unit 12 then prompts the user to select the next equalizer band in block 174.

Figure 10:
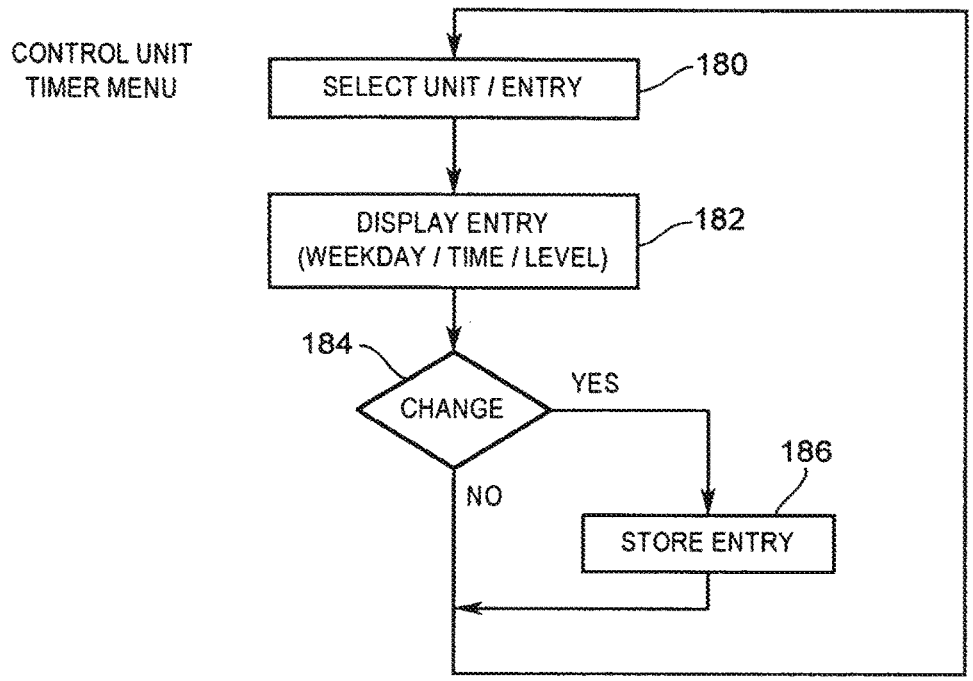
FIG. 10 shows in flowchart form the steps for setting the timer function for the control unit.

Reference is next made to FIG. 10, which shows the operation of the timer functional module 68 and menu in more detail. The first step 180 as shown in FIG. 8 comprises prompting the user to select one of the master sound masking units 14 for setting the timer function. In response to the user's action, the control unit 12 displays the Weekday/Time/Level setting for the selected unit 14, and the user is prompted to change the setting. If the user changes the setting in step 184, then the new setting is stored by the control unit 12 and also applied to the selected sound masking unit 14.

Figure 11:
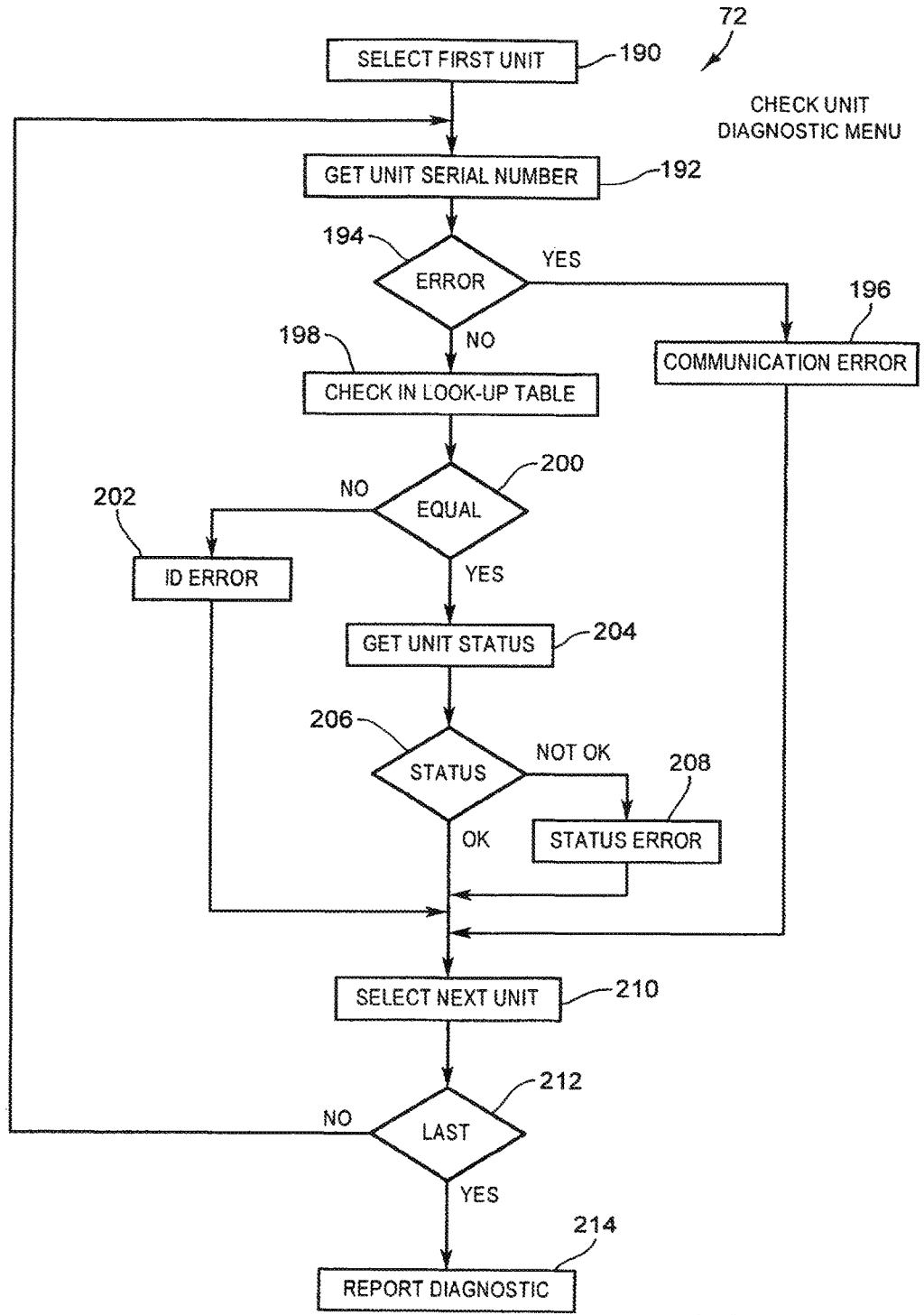
FIG. 11 shows in flowchart form the processing steps for a diagnostics function in the control unit for the networked sound masking system.

Reference is next made to FIG. 11, which shows the operation of the diagnostic functional module 68 and menu for the control unit 12 in more detail. The first step 190 involves prompting the user to select one of the master sound masking units 14 for the diagnostic test. In response, the control unit 12 retrieves the serial number from the master sound masking unit 14 over the network 13 as indicated by block 192. If there is an error (as indicated by decision block 194), then a communication error 196 is logged for that unit 14 and another unit 14 is selected 210. If there is no communication error (decision block 194), then the control unit 12 checks the serial number against the entry stored in a lookup table in block 198. If the serial number does not match the entry in the lookup table, then an identification error is logged in block 202, and another master sound masking unit 14 is selected in block 210. If the serial number matches the entry in the lookup table (decision block 200), then the status for the master sound masking unit 14 is queried by the control unit 12 in block 204. The status of the selected master sound masking unit 14 is checked in block 206, and if the status is fail or does not meet specifications, then a status error is logged in block 208. The next step in block 210 involves selecting another master sound masking unit 14 and repeating steps 192 through 210, as described above, until all, or the selected group, of the master sound masking units 14 have been queried as determined in block 212. The last step in the operation of the diagnostic function module 68 comprises generating and/or displaying a diagnostics report as indicated in block 214.

Figure 12A:
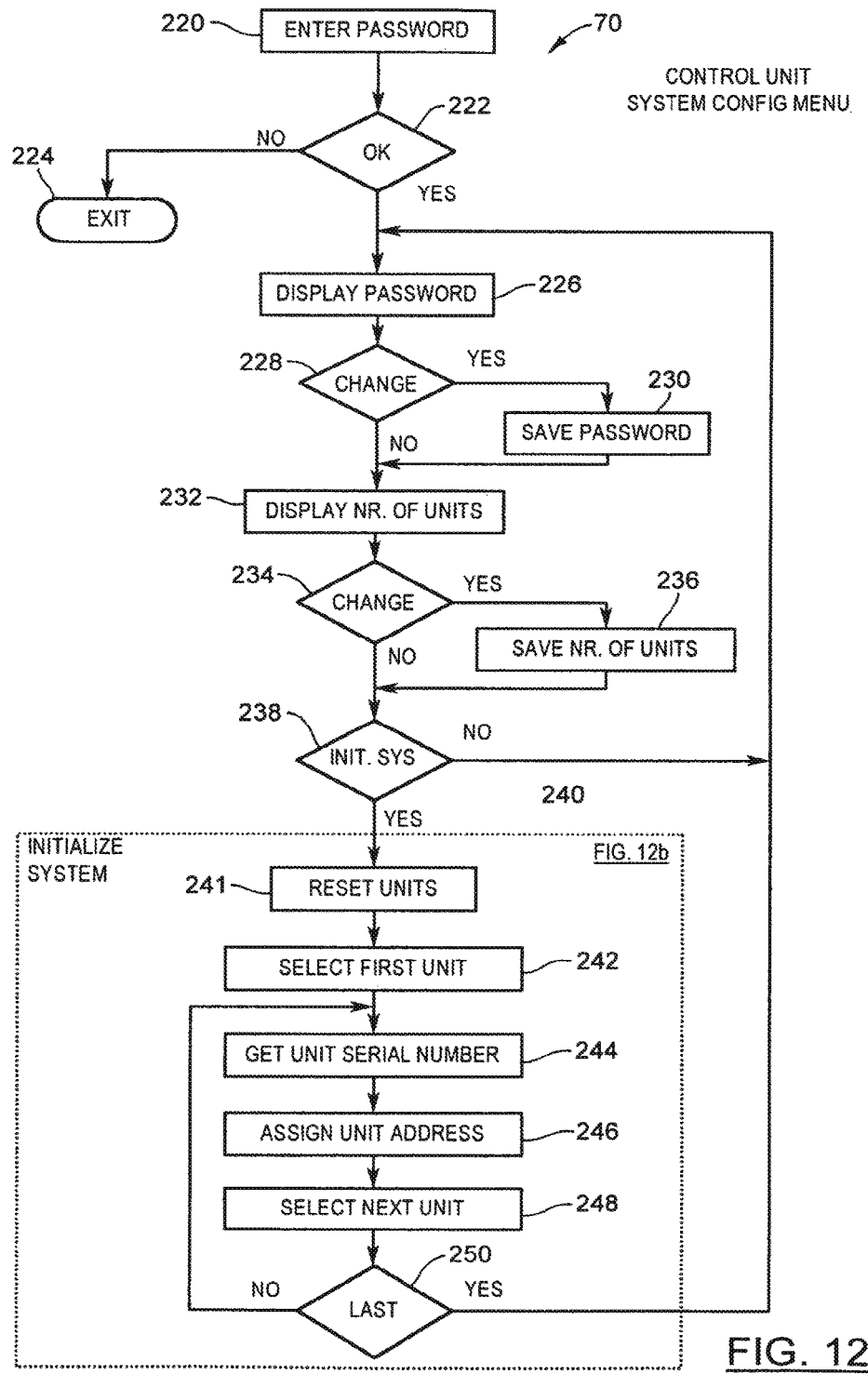
FIG. 12(a) shows in flowchart form the steps for a system configuration function in the control unit for the networked sound masking system.
Figure 12B:
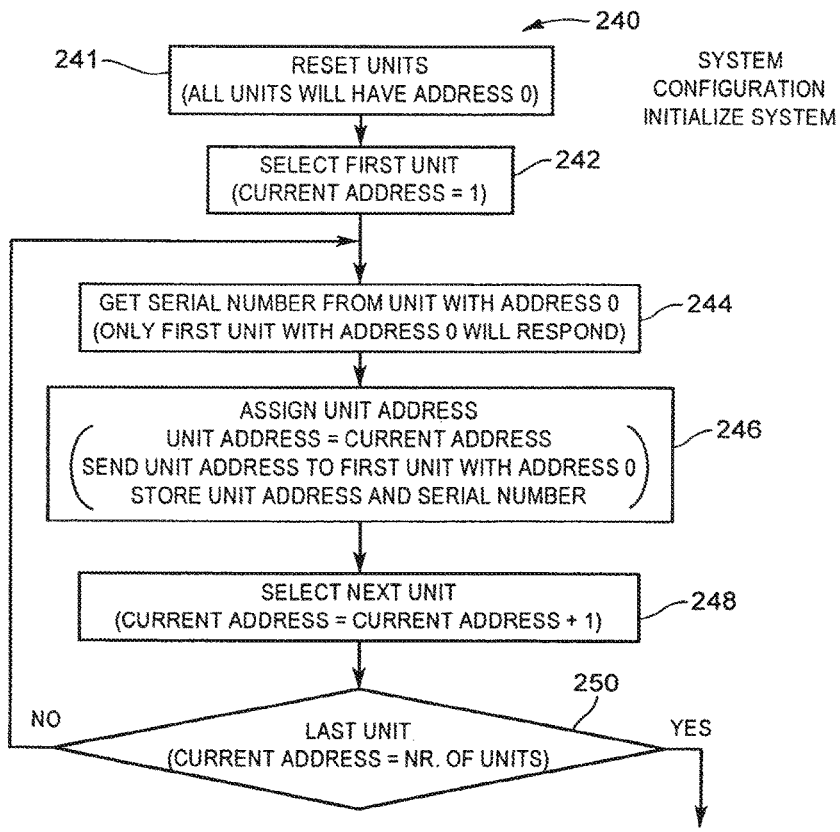
FIG. 12(b) shows in flowchart form the steps for configuring addresses for the sound masking units according to an aspect of the present invention.

Reference is next made to FIG. 12(*a*), which shows the operation of the system configuration and addressing functional module 70 and menu for the control unit 12 in more detail. The control unit 12 is preferably password protected, and the first step 220 involves prompting the user to enter a password. If the password is incorrect (decision block 222), then further access is denied (block 224). If the entered password is correct, the password is displayed in block 226, and the user is given the option of changing the password (decision block 228). If the user changes the password, then the new password is saved in block 230. The next step 232 involves displaying the number of master sound masking 14 that are presently configured for the network 13. If the system 10 is being setup for the first time, the number of units may be configured at the factory or entered in the field by the technician. The user is given the option of changing the number of units 14 configured for the system 10 in decision block 234, and the new number of units 14 is stored in step 236.

Referring still to FIG. 12(*a*), in decision block 238, the user is prompted to initialize the system 10. If the user elects to initialize the system 10, then the control unit 12 executes an initialization procedure indicated generally by reference 240. The initialization procedure 240 is shown in more detail in FIG. 12(*b*). As shown, the first step 241 in the initialization procedure 240 involves resetting all of the master sound masking units 14 connected to the network 13. As a result of the reset operation 241, each of the master sound masking units 14 has a logical address of 0. Since all of the units 14 have logical address 0, the first sound masking unit 14, i.e. unit 14*a*, responds when the control unit 12 queries the units 14 as indicated by block 242. The selected unit 14 is then queried for its serial number in block 244. The serial number 244 is assigned to the unit 14 at the time of manufacture and preferably comprises a code stored in non-volatile memory in the unit 14. The serial number may be rewritten by the control unit 12 as described in more detail below. The control unit 12 uses the serial number to generate a unit address, i.e. logical address, for the unit 14 as indicated in block 246. The serial number is preferably stored in memory, for example a look-up table in the control unit 12, and provides a cross-reference to the master sound masking unit 14. The current logical address generated in step 246 is unique for the unit 14 in the present network configuration 10, but for another network configuration the logical addresses may be regenerated. Following the addressing operation, the next sound masking unit 14 is selected by the control unit 12 and the current logical address is incremented for the next sound masking unit 14. The operations for assigning the current logical address to the unit 14 based on the serial number according to steps 244 to 248 are repeated. These operations are repeated until all of the sound masking units 14 have been assigned current logical addresses by the control unit 12 as indicated by decision block 250. Following this scheme, the current logical address for the last sound masking unit 14 is equal to the number of sound masking units 14 connected to the networked system 10.

Figure 13:
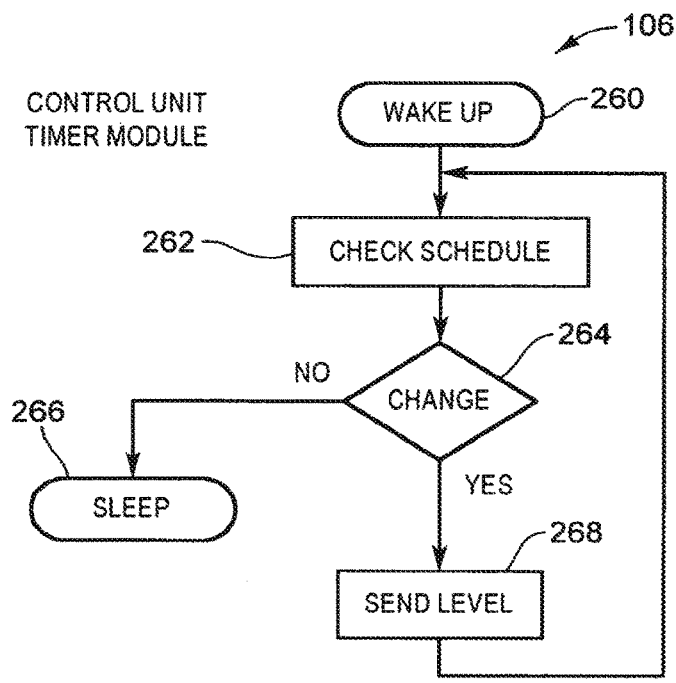
FIG. 13 shows in flowchart form the processing steps for the timer function for the control unit.

Reference is next made to FIG. 13, which shows the timer function 106 (FIG. 5) in more detail. In response to an interrupt or a request from a polling loop, a wake-up call or "clock tick" is periodically issued as indicated in step 260, and a schedule of timed events is checked in block 262. The timed events may comprise, for example, changes in the level of the sound masking signal for all or some the master sound masking units 14 (and the associated satellite sound masking units 16). If the schedule indicates that there is no change in sound masking level, then the timer function 106 goes to sleep (block 266). If there is a scheduled change, then the new level for the sound masking signal is transmitted via the network 13 to the affected sound masking units 14 (block 268).

Figure 14:
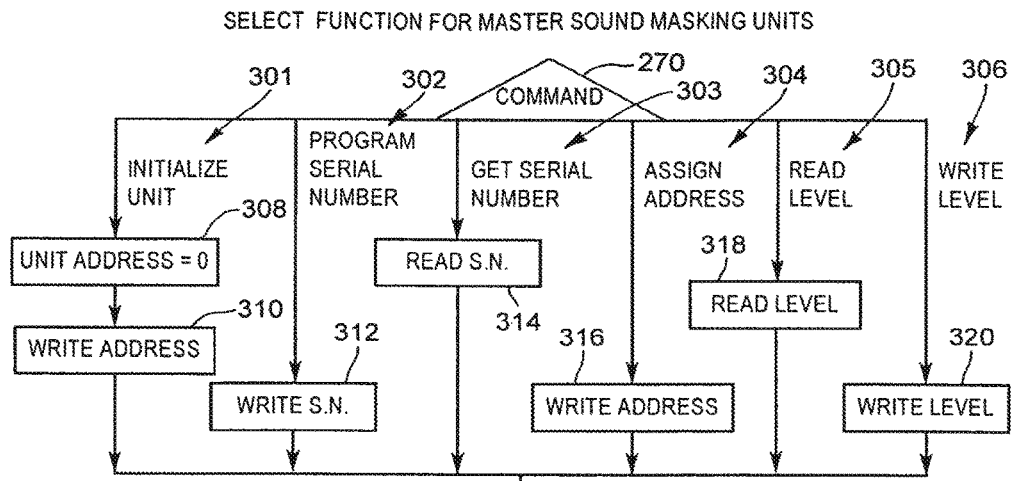
FIG. 14 shows in flowchart form functions for controlling the sound masking units in the networked sound masking system according to the present invention.

Reference is next made to FIG. 14, which shows in flowchart form the control structure 300 for controlling the master sound masking units 14. As shown, the control structure 300 includes an initialization procedure 301, a program serial number procedure 302, a read serial number procedure 303, an assign logical address procedure 304, a read sound masking signal level procedure 305, and a write sound masking signal level procedure 306.

The initialization procedure 301 comprises a function 304 for resetting the logical addresses and a function 306 for generating and writing logical addresses for the units 14 as described above with reference to FIG. 12. The program serial number procedure 302 provides a mechanism for programming or regenerating the serial number stored in non-volatile memory for each unit 14. The procedure 302 comprises a write serial number function 312. The read serial number procedure 303 comprises a read serial number function 314 which the control unit 14 utilizes to read the serial numbers of the units 14, for example, as described above with reference to FIG. 12. The assign logical address procedure 304 comprises a write address function 316 for writing, i.e. assigning, logical addresses to the sound masking units 14. The read level procedure 305 comprises a read level function 318 which allows the control unit 12 to read the current level setting for the sound masking signal in the unit 14 being addressed by the control unit 14 or the remote control unit. The write level procedure 306 comprises a write level function 320 which allows the control unit 12 (or remote control unit) to write, i.e. set, the level setting for the sound masking signal in the unit 14 being addressed by the control unit 14 or the remote control unit. Once the unit 14 is selected, the control unit 12 next selects the function to be queried/programmed, and then reads the parameter setting from the digital control device 33 to 37 (e.g. the digi-pot for the filter stage 32 in FIG. 2) using the read level function 318, or writes the parameter setting to the digital control device 33 to 37 (e.g. the digi-pot the audio power amplifier stage 36 in FIG. 2), using the write level function 320.

Figure 15:
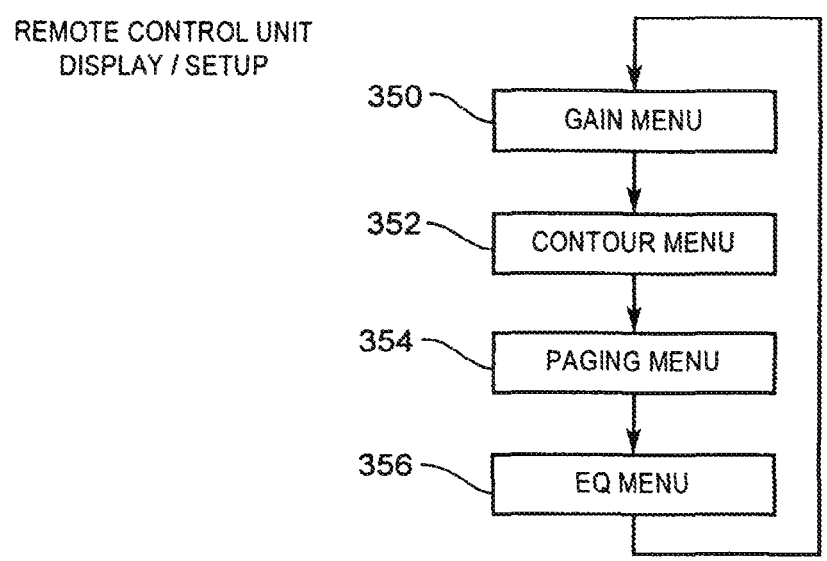
FIG. 15 shows in flowchart form functions implemented for the remote control unit in the networked sound masking system according to the present invention.

As described above with reference to FIG. 1, the remote control unit 18 works in conjunction with the control unit 12 to display and/or adjust the current adjustment settings (i.e. spectrum adjustment settings, equalizer settings, masking signal volume level, and paging volume) for the master units 14. The remote control unit 18 is operated through menu functions as shown in FIG. 15. Referring to FIG. 15, the function menus for the remote control unit 18 comprise a gain control menu 350, a contour control menu 352, a paging control menu 354, and an equalizer control menu 356. The user uses these menus to program (i.e. write) and read the gain, contour, and paging functions as described above for the control unit 12.

As described above, the sound masking units 14 according to the present invention include an equalizer stage 34 which allows the shaping of the sound spectrum of the sound masking noise signal output. Advantageously, the capability to address each of the sound masking units 14 allows the equalizer stage 34 to be individually set for each of the units 14 or a group of the units 14, and this capability greatly enhances the functionality of the networked sound masking system 10 according to the present invention.

Figure 16:
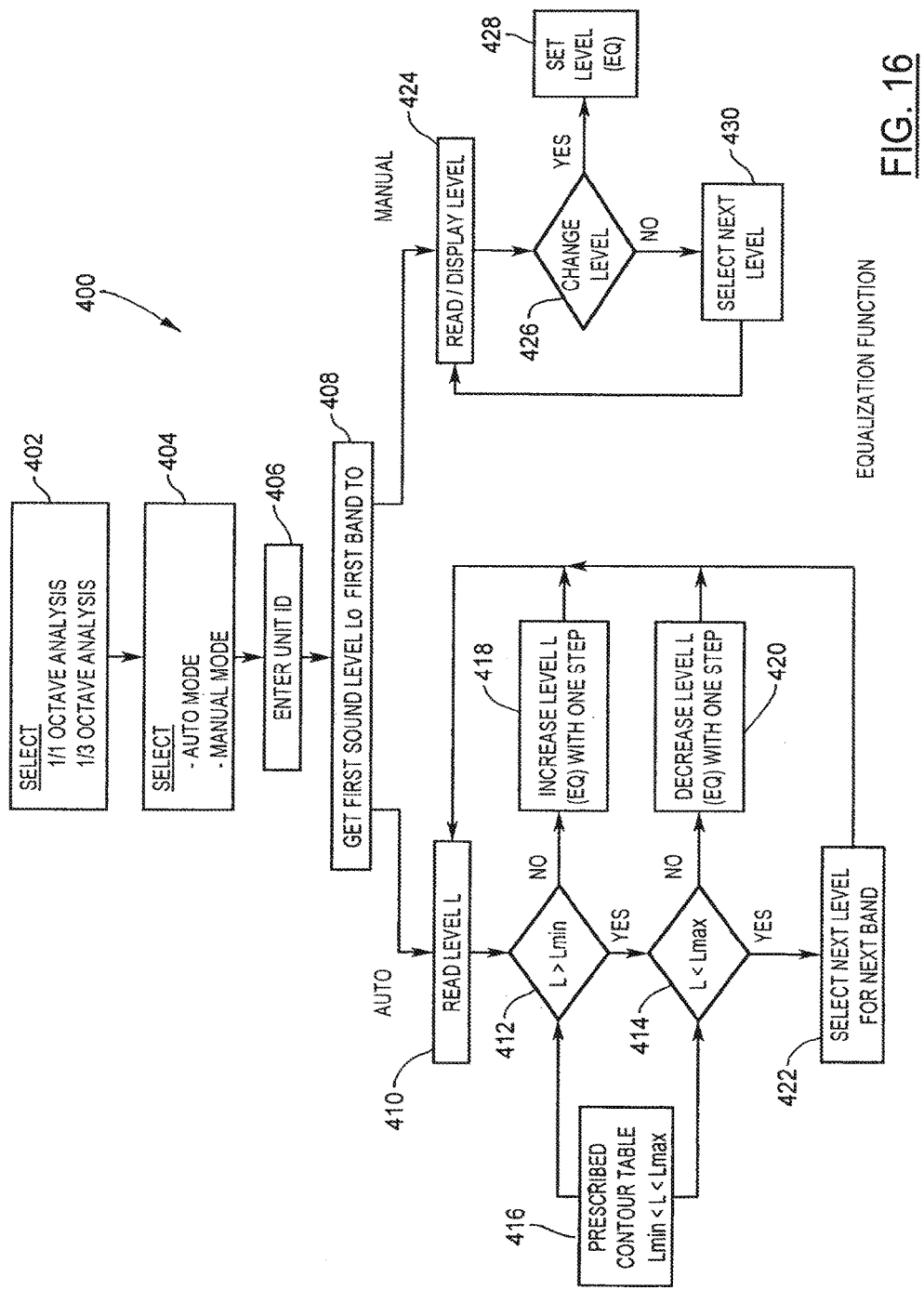
FIG. 16 shows in flowchart form the processing steps for an equalization function in the networked sound masking system according to the present invention.

Reference is made to FIG. 16 which shows a procedure 400 according to another aspect of the invention for controlling the equalizer function in each of the sound masking units 14. According to this aspect, the remote control unit 18 (FIG. 1) includes a serial communication interface 21 (e.g. radio or hard-wire link) which couples to a sound level meter 23 (FIG. 1), such as the RION NA-27 meter. The sound level meter 23 is used to take sound level readings for the physical space and these readings are transmitted to the remote control unit 18 via the serial communication interface 21. As will now be described with reference to FIG. 16, the readings from the sound level meter 23 are used in conjunction with settings in a Prescribed Contour Table stored in the control unit 12 or the remote control unit 18 to adjust the level settings in the equalizer stages 34 for the sound masking units 14.

As shown in FIG. 16, the first operation in the equalization procedure 400 comprises selecting a 1/1 Octave analysis or a 1/3 Octave analysis as indicated in block 402. The next operation involves selecting between an automatic mode of operation or a manual mode of operation as indicated in block 404. Once the mode of operation is selected, the user (i.e. technician) enters the unit ID to address the sound masking unit 14 on which the equalizer function is to be adjusted/programmed (block 406). Once the unit 14 is addressed, the remote unit 18 queries the unit 14 for the first sound level setting $L_o$ for the first frequency band $f_o$ as indicated in block 408.

Figure 17:
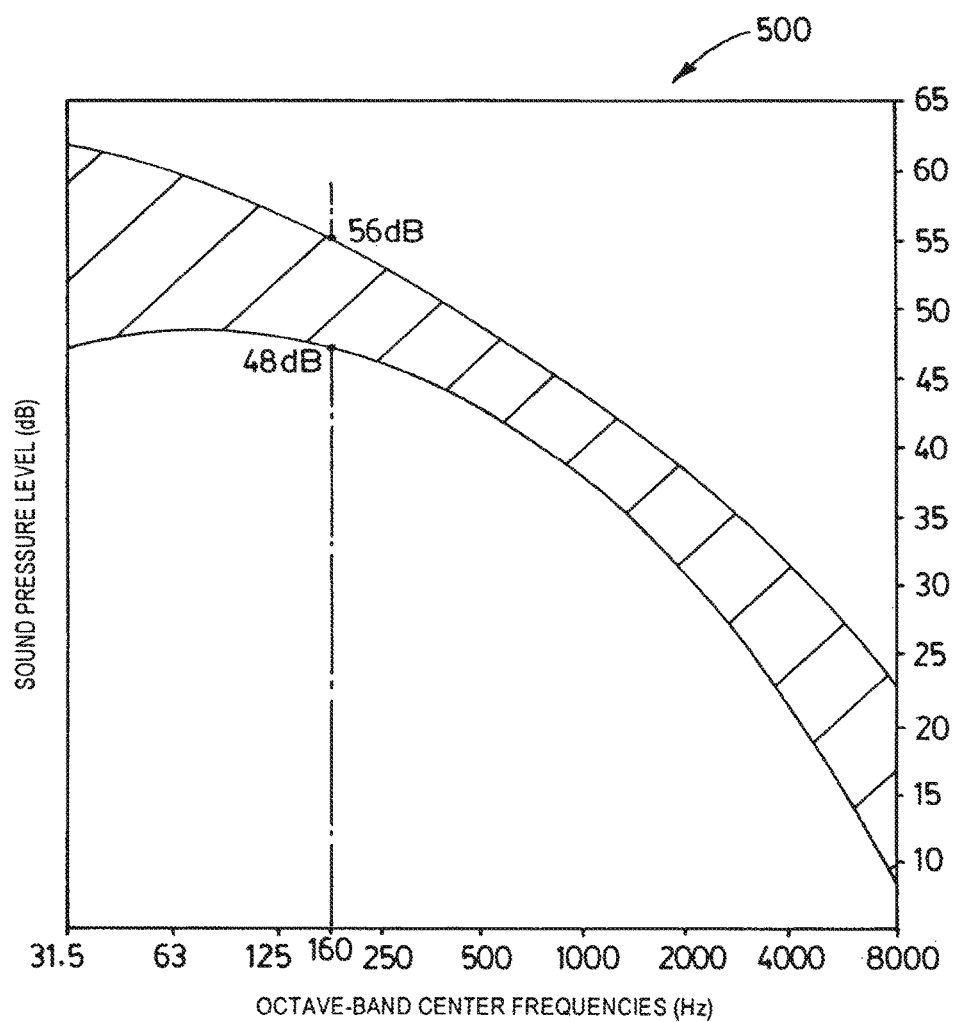
FIG. 17 shows in graphical form a Prescribed Spectrum Contour table for the sound masking signal.

Referring still to FIG. 16, if the automatic mode of operation is selected (block 404), then the sound level meter 23 reads the level setting L from the unit 14 (block 410) and the level setting L is compared to a minimum level setting $L_{min}$ in block 412 and a maximum level setting $L_{max}$ in block 414. The minimum $L_{min}$ and maximum $L_{max}$ level settings are determined from a Prescribed Contour Table 500 (block 416) such as depicted in FIG. 17. If the level setting L is not greater than the minimum level setting $L_{min}$, then the remote unit 18 sends a command or message to the control unit 12 to increase the level setting L for the equalizer by one step, as indicated in block 418. If the level setting L is greater than the minimum level setting $L_{min}$, then the level setting L is compared to the maximum level setting $L_{max}$ in decision block 414. If the level setting L is not less than the maximum level setting $L_{max}$, then the remote unit 18 transmits a message to the control unit 12 to decrease the level setting L for the equalizer by one step as indicated in block 420. The control unit 12 makes the adjustment to the equalizer setting for the addressed unit 14, and sends a confirmation message to the remote unit 18. The remote unit 18 then accepts a new reading from the sound level meter 23 and the remote unit 18 reads the level setting L in block 410 and the steps in blocks 412, 418, 420 are repeated until the level setting L is set within the desired range $L_{min}$ to $L_{max}$ as defined by the Prescribed Contour Table 500 (FIG. 17). For example, the Prescribed Contour Table 500 includes the following level ranges ($L_{min}$, $L_{max}$) for the center frequencies in the 1/1 Octave band or 1/3 Octave band:

TABLE-US-00001 ($L_{min}$, $L_{max}$) Center Frequency 48 dB, 56 dB $F_0$=160 Hz 47.5 dB, 54.5 dB $F_1$=250 Hz . . . 6.5 dB, 23 dB $F_{17}$=8000 Hz Referring back to FIG. 16, once the level setting L for the current frequency band is set within the range $L_{min}$ to $L_{max}$, the level setting L for the next frequency band is selected as in block 422, and the remote control unit 18 sends a signal to the sound level meter 23 to read the next level setting L (block 410).

In the manual mode of operation (as selected in block 404), the first operation involves using the remote control unit 18 to receive and display a level setting L from the sound level meter 23 as indicated in block 424. In block 426, the level setting L is compared to the range $L_{min}$ to $L_{max}$. If the level setting L is not within the prescribed range, the desired level setting L is set or adjusted using the remote control unit 18 as indicated in block 428. In block 430, the remote control unit 18 is used to select the next frequency band for reading the next level setting (block 424).

As described above, the remote control unit 18 in conjunction with a sound level meter 23 provides an effective mechanism for adjusting the equalizer function in each of the sound masking units 14 through the control unit 12 and networked connection without the need for opening the ceiling tile to physically access any of the units 14.

The present invention may be embodied in other specific forms without departing from the spirit or essential characteristics thereof. Certain adaptations and modifications of the invention will be obvious to those skilled in the art. Therefore, the presently discussed embodiments are considered to be illustrative and not restrictive, the scope of the invention being indicated by the appended claims rather than the foregoing description, and all changes which come within the meaning and range of equivalency of the claims are therefore intended to be embraced therein

What is claimed is:

1. A networkable sound masking device comprising:
   (a) an input communication interface for interfacing to a communication network for receiving one or more sound masking control signals to control operation of the networkable sound masking device;
   (b) a controller, said controller including an address component configured to recognize one or more of said sound masking control signals addressed to the networkable sound masking device, and said controller being configured for processing said one or more sound masking control signals addressed to the networkable sound masking device;
   (c) a sound masking component for generating a sound masking output signal, said sound masking component being responsive to said controller, and said sound masking output signal being responsive to said one or more sound masking control signals addressed to the networkable sound masking device; and
   (d) an output for outputting the sound masking output signal to one or more satellite sound masking units, wherein the sound masking output signal is responsive to said one or more sound masking control signals received through the input communication interface.

2. The networkable sound masking device as claimed in claim 1, wherein said output stage comprises an amplifier configured to output said sound masking output signal at a controllable output level, and said one or more sound masking control signals comprise a masking volume signal, and said controller including a component for controlling the output level of said amplifier in response to said masking volume signal.

3. The networkable sound masking device as claimed in claim 1, wherein said sound masking component comprises a random noise generator having an output coupled to an equalizer stage, and said one or more sound masking control signals comprise a masking frequency signal, and said controller including a component responsive to said masking frequency signal for controlling said equalizer stage.

4. The networkable sound masking device as claimed in claim 3, wherein said output stage comprises an amplifier, and said one or more sound masking control signals comprise a masking volume signal, and said controller includes a component for controlling the output level of said amplifier in response to said masking volume signal.

5. A networkable sound masking device comprising:
   (a) an input communication interface for interfacing to a sound masking command control network for receiving sound masking control signals to control operation of said networkable sound masking device;
   (b) a controller for receiving said control signals from said input communication interface, said control signals being intended for the networkable sound masking device and said control signals comprising a masking volume command;
   (c) a sound masking component for generating a sound masking output signal, said sound masking component being responsive to said controller, and said sound masking output signal being responsive to said masking volume command for controlling a volume level associated with said sound masking output signal; and
   (d) an output for outputting the sound masking output signal to one or more satellite sound masking units, wherein the sound masking output signal is responsive to said one or more sound masking control signals received through the input communication interface.

6. The networkable sound masking device as claimed in claim 5, wherein said input interface includes an address component for recognizing said control signals intended for the networkable sound masking device.

7. The networkable sound masking device as claimed in claim 5, wherein said output stage comprises an amplifier and said controller including a component for controlling said output stage in response to said masking volume command.

8. The networkable sound masking device as claimed in claim 5, wherein said sound masking component comprises a random noise generator having an output coupled to an equalizer stage, and said controller including a component for controlling said equalizer stage in response to a masking frequency setting command.

9. The networkable sound masking device as claimed in claim 8, wherein said output stage comprises an amplifier and controller including a component for controlling said output stage in response to said masking volume command.

* * * * *